(12) United States Patent
Stevens

(10) Patent No.: US 7,526,972 B2
(45) Date of Patent: May 5, 2009

(54) PROBE HOLDER FOR VARIOUS THICKNESS SUBSTRATES

(75) Inventor: Kerry A. Stevens, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 215 days.

(21) Appl. No.: 11/430,399

(22) Filed: May 8, 2006

(65) Prior Publication Data
US 2007/0256511 A1    Nov. 8, 2007

(51) Int. Cl.
*G01D 21/00* (2006.01)
(52) U.S. Cl. .................................... 73/866.5
(58) Field of Classification Search ............... None
See application file for complete search history.

(56) References Cited

U.S. PATENT DOCUMENTS

| | | | |
|---|---|---|---|
| 5,707,151 A * | 1/1998 | Parker et al. ............... 374/120 |
| 5,971,171 A * | 10/1999 | Thorp et al. ............ 211/128.1 |
| 6,209,828 B1 * | 4/2001 | Au ............................. 248/116 |
| 6,446,000 B2 | 9/2002 | Shimabara |
| 6,462,529 B1 | 10/2002 | Campbell |
| 6,812,719 B1 | 11/2004 | Barr et al. |
| 6,967,473 B1 | 11/2005 | Reed et al. |
| 2004/0201388 A1 | 10/2004 | Barr |
| 2005/0072252 A1 * | 4/2005 | Kumar et al. ............. 73/866.5 |

FOREIGN PATENT DOCUMENTS

| | | |
|---|---|---|
| EP | 1326078 B1 | 11/2004 |
| WO | WO 86/04685 | 8/1986 |

\* cited by examiner

*Primary Examiner*—Robert R Raevis
(74) *Attorney, Agent, or Firm*—William K. Bucher

(57) ABSTRACT

A probe holder for a signal acquisition probe has a cradle receiving the signal acquisition probe and a pedestal adapted for receiving substrates of various thicknesses. The pedestal has a base member and an upright member with the upright member coupled to the cradle. The base member has at least a first lateral slot formed therein having a plurality of clearances for receiving substrates of varying thicknesses.

7 Claims, 4 Drawing Sheets

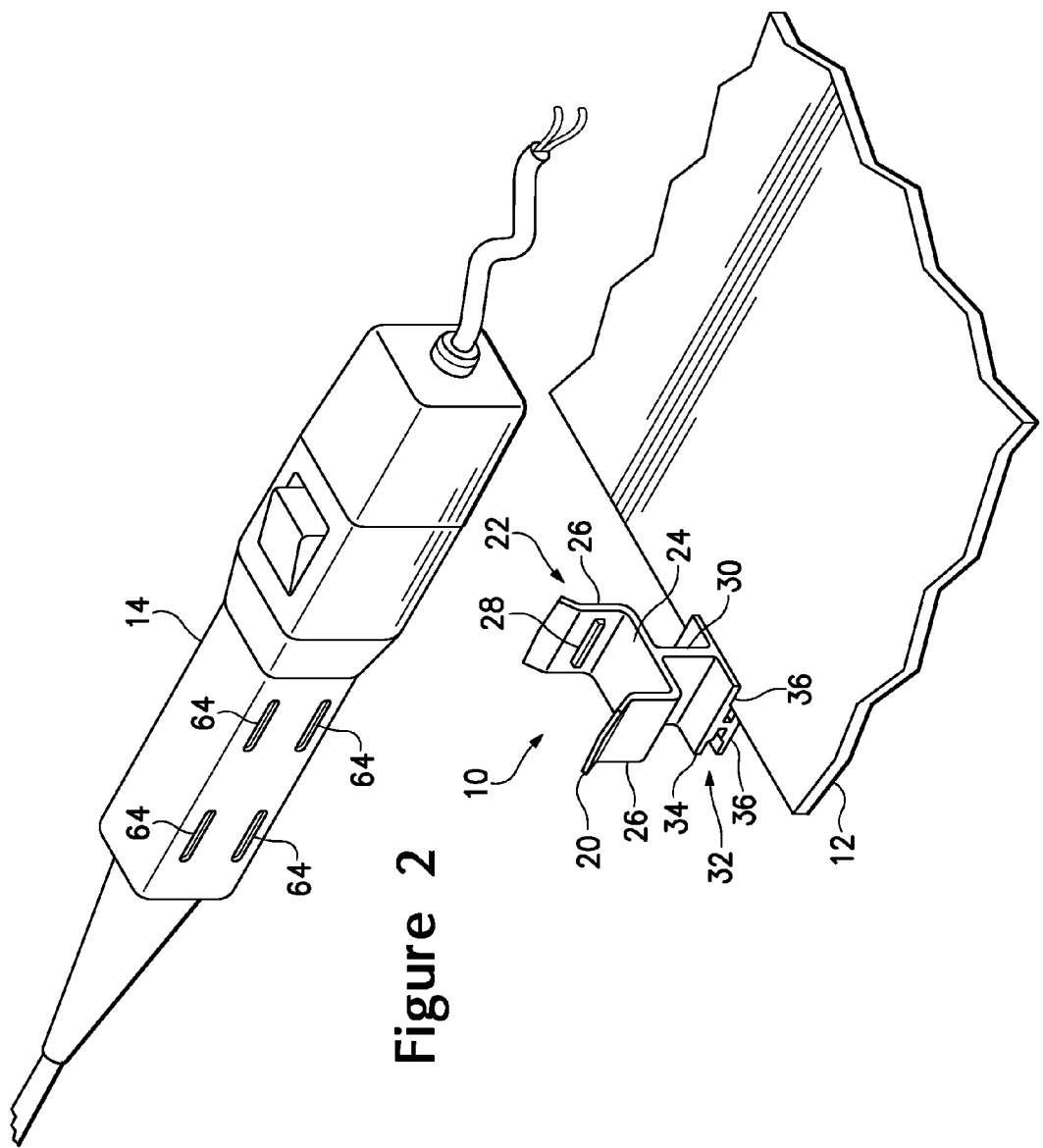

PROBE HOLDER FOR VARIOUS THICKNESS SUBSTRATES

BACKGROUND OF THE INVENTION

The present invention relates generally to probe holders and more particularly to a probe holder for various thickness substrates.

Signal acquisition probes acquire electrical signals from a device under test and couple these signal to a measurement test instrument, such as an oscilloscope, logic analyzer, spectrum analyzer and the like. The signal acquisition probe has a probing tip or tips extending from a probe body that contact test points on the device under test. The signal acquisition probe may be a hand-held device that a user manipulates by hand to probe test points on the device under test. The user may also position the probing tip or tips to the probe test points using a probe holder that allows hands free probing of the device under test.

The are many types of hands-free probe holders available. One type has an articulated probe arm that is mounted to a movable base, a spring clamp, or vice that is clamped to the device under test. The articulated arm has a mounting element for securing the signal acquisition probe to the articulated arm. The articulated arm has sufficient stiffness that allows the arm to be moved and held at a desired position. Another type of hands-free probe holder is described in U.S. Pat. No. 6,462,529. The probe holder is a pair of angled support members having a adapter for securing a signal acquisition probe. The combination of the support members and the signal acquisition probe forms a tripod that supports the probe on the device under test for hands-free probing.

U.S. Published Application No. 2004/0201388 describes a probe stand for an electronic probe. The probe stand has support that is mountable to a circuit board and a clamp to retain the probe to the stand. The stand may include a foot that includes a magnet for mounting the stand to a magnetic material. The foot may also include a pin that may be inserted into a hole in the circuit board to mount the stand in a region of the circuit board. The foot may also include an adhesive to help prevent the support from slipping on the circuit board. The stand may also include two or more legs to mount the stand on the circuit board without securing the stand to the circuit board. The foot may also have a vice that may be clamped around an edge of the circuit board or housing of the electronic device. The clamp may be a "U" shaped body having a threaded post for allowing a user to substitute a different clamp with the stand or substitute a different stand with the clamp. The clamp may also be formed of a mounting surface having a strap that retains the probe to stand. One end of the strap is secured to the mounting surface with the other end releasably attaches to a cleat.

The architecture of signal acquisition probe have changes to where the probing tips are no longer disposed in the probing head but are disposed in probing adapters that are removably coupled to the probing head by cables. Various adapters are made that allow users to secure the adapters to the device under test and move the probing head from adapter to adapter. This new architecture does not lend itself to tripod type probe holders where the probing tip or tips of the signal acquisition probe are the contact point for one of the legs. Further, probe holders using articulated arms can be expensive, especially where a user requires a number of articulated arms for securing multiple probes to a device under test.

What is needed is an probe holder that is compatible with the new probe architectures and is easily mountable on or near a device under test. The probe holder should allow flexibility with different type of devices under test. The probe holder should also be inexpensive to allow moving a probe or probes between multiple probe holders.

SUMMARY OF THE INVENTION

The above needs for a probe holder are met with the probe holder that is mountable on substrates having various thicknesses. The probe holder has a cradle receiving the signal acquisition probe and a pedestal having a base member and an upright member. The upright member is coupled to the cradle and the base has a lateral slot formed therein having a plurality of clearances adapted for receiving substrates of various thicknesses.

The probe holder cradle has a "U" shaped member having a base and opposing sidewalls extending from the base with the upright member of the pedestal coupled to the "U" shaped member base. The opposing sidewalls of the "U" shaped member preferably have a rib formed on each the inner surface of the sidewalls for mating with corresponding slots formed in the signal acquisition probe. Alternately, each inner surface of the sidewalls may have a slot formed therein for mating with corresponding ribs formed on the signal acquisition probe. The opposing sidewalls of the "U" shaped member preferably have outwardly extending upper portions for ease of inserting and removing the probe from the probe holder.

The base member has substantially flat top and bottom surfaces with the top surface transitioning to the upright member. The slot is disposed between the top and bottom surfaces with the slot defined by opposing substantially lateral interior surface in the base member. The lateral interior surfaces define the plurality of clearances. The base member may also have opposing slots formed therein with the slots disposed between the top and bottom surfaces. One slot has a plurality of clearances adapted for receiving substrates of various thicknesses and the other slot has a clearance adapter for receiving a substrate having a clearance different from the plurality of thicknesses of the other slot. The opposing slots may each a plurality of clearances adapted for receiving substrates of various thicknesses.

The objects, advantages and novel features of the present invention are apparent from the following detailed description when read in conjunction with appended claims and attached drawings.

BRIEF DESCRIPTION OF THE DRAWINGS

FIG. 2 is a perspective view of the probe holder mounted to a substrate.

DETAILED DESCRIPTION OF THE PREFERRED EMBODIMENT

Figure 1:
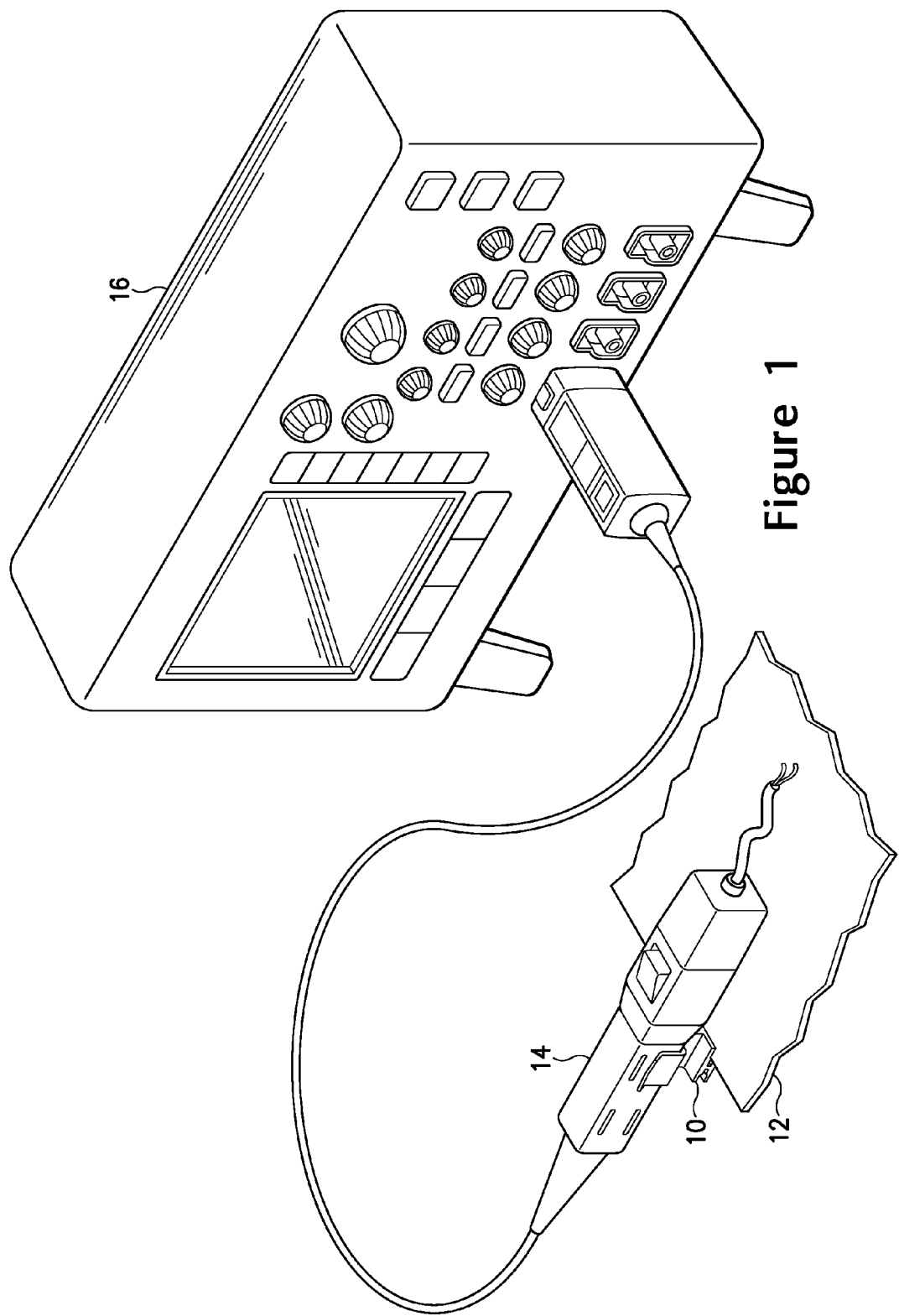
FIG. 1 is a perspective view of the probe holder mounted on a substrate and capturing a signal measurement probe.

Referring to FIG. 1, there is shown a perspective view of the probe holder 10 mounted on a substrate 12. The substrate may be a circuit board, sheet metal of a housing in which the circuit board is disposed, or the like. The signal acquisition probe 14 is positioned in the probe holder 10. The signal acquisition probe 14 may be any probing device that generated an electrical signal coupled to a measurement test instrument, such as oscilloscope 16, a logic analyzer, spectrum analyzer or the like. The signal acquisition probe 14 may be a voltage probe, current probe, temperature probe or the like.

Referring to FIG. 2, there is a perspective view of the probe holder 10 mounted to the substrate 12. The probe holder has a cradle 20 which receives the signal acquisition probe 14. The cradle 20 has a "U" shaped member 22 having a base 24 and opposing sidewalls 26. Disposed on the inner surfaces of the opposing sidewalls 26 are attachment members 28 for securing the signal acquisition probe 14 in the cradle 20. The signal acquisition probe 14 has features formed therein, such as slots, ribs or the like, that mate with the attachment members in the cradle 20. The base 24 of the cradle 20 is coupled to an upright member 30 of a pedestal 32. The pedestal 32 has a base member 34 to which the upright member 30 is secured. The base member 34 has at least a first lateral slot 36 formed therein having multiple clearances adapted for receiving substrates 12 of various thicknesses. The probe holder 10 is preferably formed of a non-conductive material, such as glass filled nylon, ABS plastic or the like. The cradle 20 and the pedestal 30 are preferably formed as a unitary part. Alternately, the cradle 20, the upright member 30 and the base member 34 may be formed as separate parts with each part having keys and slots. The keys mate with the slots and are secured with an adhesive such as epoxy or the like. Alternately, the cradle 20, the upright member 30 and the base member 34 may secured together using sonic welding or the like.

Figure 3B:
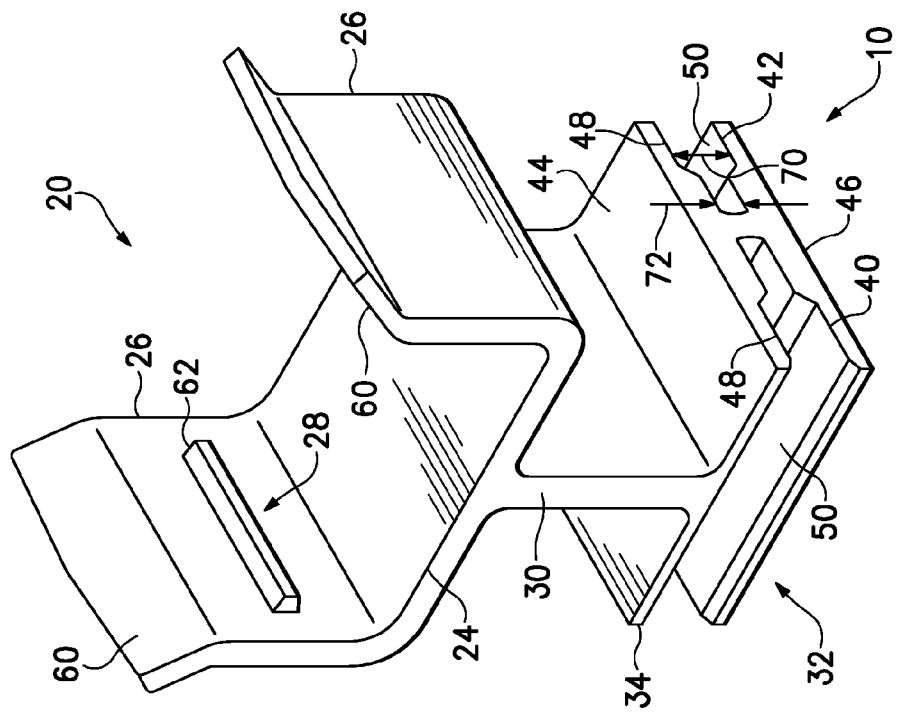
FIG. 3A through FIG. 3D are perspective views of various embodiments of the probe holder.
Figure 3A:
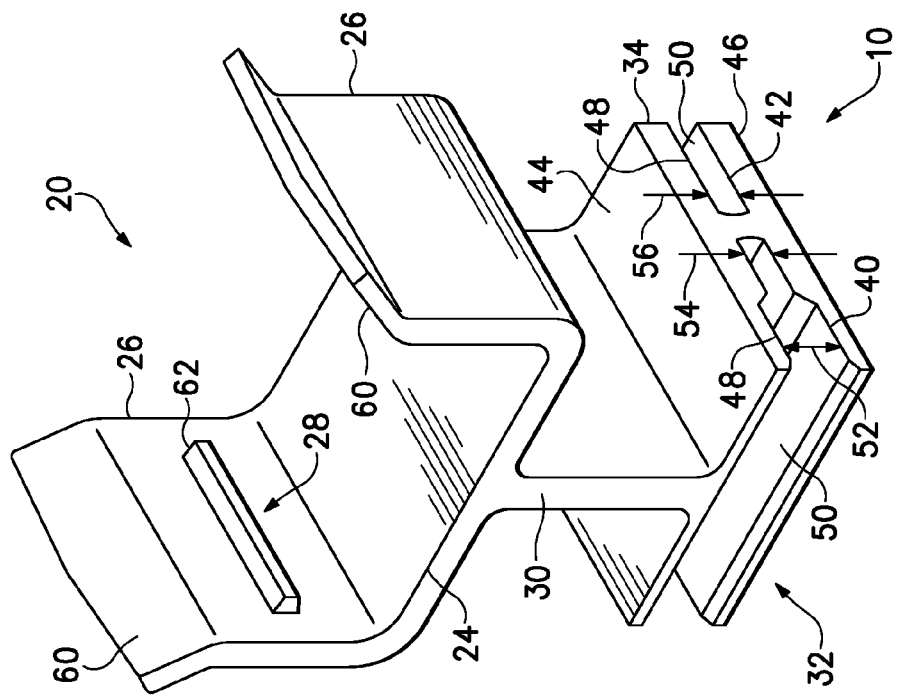

Referring to FIGS. 3A through FIGS. 3D, there are shown various embodiments of the probe holder 10. FIG. 3A illustrates the base member 34 of the probe holder 10 having opposing slots 40 and 42. The base member 34 has top and bottom surfaces 44 and 46 and contain substantially lateral interior surfaces 48 and 50 defining the respective slots 40 and 42. The interior surfaces 48 and 50 of slot 40 define slot clearances 52 and 54 with the slot clearance 52 being larger than clearance 54. This allows a substrate with a larger thickness to be inserted into a first portion of the slot 40 having the larger clearance and a substrate with a smaller thickness to pass through the first portion of the slot 40 and be inserted into smaller slot clearance. Substrates are secured in slot 40 by frictional mating with the interior surfaces 48 and 50 of the slot 40. The interior surfaces 48 and 50 of slot 42 defines a single slot clearance 56 that secures a substrate by frictional mating with the interior surfaces 48 and 50 of the slot 42. In the preferred embodiment, the clearances 52, 54 and 56 are respectively 0.097 inches, 0.051 inches and 0.062 inches but other clearance dimensions may be used for each and all of the clearance dimensions without departing from the scope of the present invention.

FIG. 3A also slows the opposing walls 26 of the cradle 20 with outwardly extending upper portions 60. The outwardly extending upper portions 60 aid in the insertion and removal of the signal acquisition probe 14 from the cradle 20. The outwardly extending upper portions 60 are preferably tapered. The attachment members 28 on the interior surfaces of the opposing walls 26 of the cradle 20 are shown as lateral ribs 62 which mate with corresponding lateral slots 64 formed in the signal acquisition probe 14 as shown in FIG. 2.

Figure 3D:
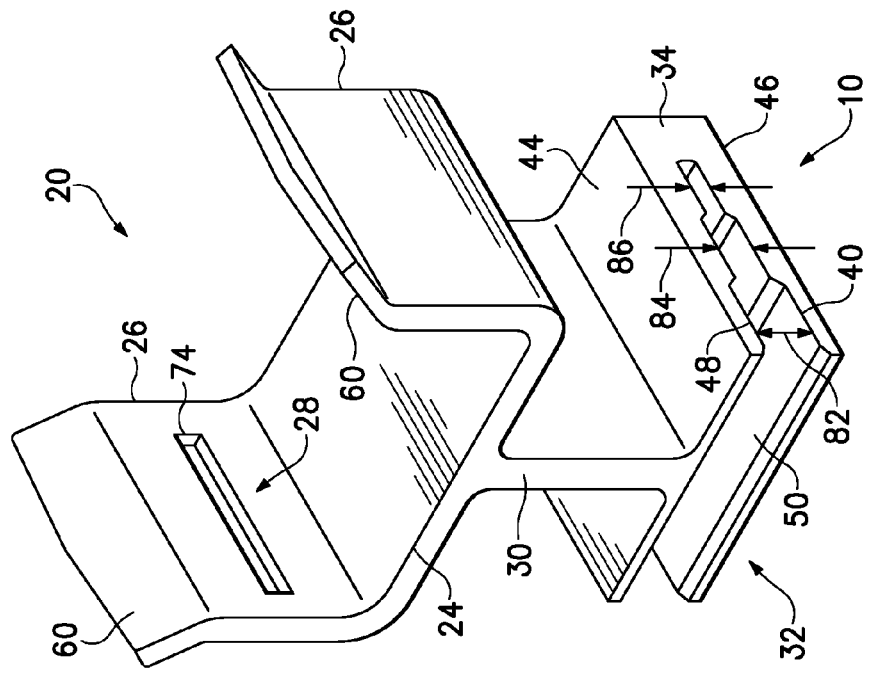
Figure 3C:
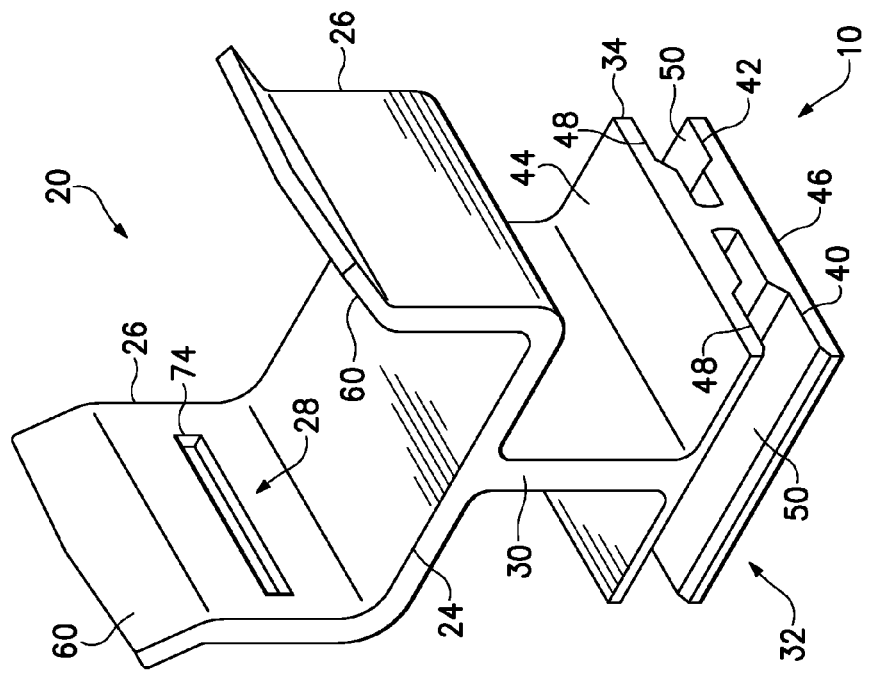

FIG. 3B shows a further embodiment of the probe holder 10 where the interior surfaces 48 and 50 of slot 42 defines multiple clearances 70 and 72 similar to slot 40 in FIG. 3A. FIG. 3C shows another embodiment of the probe holder 10 where the attachment members 28 are lateral slots 74 formed in the interior surfaces of the opposing sidewalls 26 of the cradle 20. The lateral slots 74 mate with corresponding lateral ribs formed on the signal acquisition probe 14. FIG. 3D show still another embodiment of the probe holder 10. The base member 34 has a single slot 80 where the substantially lateral interior surfaces 48 and 50 define slot clearances 82, 84 and 86 having similar slot clearances to slot clearances 52, 54 and 56 of slots 40 and 42 in FIG. 3A.

It will be obvious to those having skill in the art that many changes may be made to the details of the above-described embodiments of this invention without departing from the underlying principles thereof. The scope of the present invention should, therefore, be determined only by the following claims.

What is claimed is:

1. A holder for a signal acquisition probe mountable on various thickness substrates comprising:
    a cradle receiving the signal acquisition probe; and
    a pedestal having a base member and an upright member with the upright member coupled to the cradle and the base member having opposing substantially parallel interior surfaces defining a slot therein, with the opposing substantially parallel interior surfaces defining a plurality of clearances adapted for securing substrates of various thicknesses.

2. The holder as recited in claim 1 wherein the cradle comprises a "U" shaped member having a base and opposing sidewalls extending from the base with the upright member of the pedestal coupled to the "U" shaped member base.

3. The holder as recited in claim 2 wherein the "U" shaped member further comprises interior surfaces having rib attachment members for mating with corresponding slots formed in the signal acquisition probe for securing the signal acquisition probe to the holder.

4. The holder as recited in claim 2 wherein the opposing sidewalls of the "U" shaped member further comprise outwardly extending upper portions.

5. The holder as recited in claim 1 wherein the cradle comprises a "U" shaped member having a base and opposing sidewalls extending from the base with the upright member of the pedestal coupled to the "U" shaped member base and each of the opposing sidewalls having a slot therein for mating with corresponding ribs formed in the signal acquisition probe for securing the signal acquisition probe to the holder.

6. The holder as recited in claim 1 further comprising the base member having opposing slots formed therein with each slot disposed between opposing substantially parallel interior surfaces with the opposing substantially parallel interior surfaces of one slot defining a plurality of clearances adapted for securing substrates of various thicknesses and the other opposing substantially parallel interior surfaces of the other slot defining a clearance adapted for securing a substrate having a clearance different from the plurality of thicknesses of the other slot.

7. The holder as recited in claim 1 further comprising the base member having opposing slots formed therein with each slot disposed between opposing substantially parallel interior surfaces with the opposing substantially parallel interior surfaces of each slot defining a plurality of clearances adapted for securing substrates of various thicknesses.

* * * * *